United States Patent [19]
Ping

[11] Patent Number: 6,005,385
[45] Date of Patent: *Dec. 21, 1999

[54] TEST BOARD CIRCUIT FOR DETECTING TESTER MALFUNCTION AND PROTECTING DEVICES UNDER TEST

[75] Inventor: King-Ho Ping, Tainan, Taiwan

[73] Assignee: Taiwan Semiconductor Manufacturing Company, Ltd., Hsin-Chu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 08/668,709

[22] Filed: Jun. 24, 1996

[51] Int. Cl.$^6$ ........................................... G01R 31/02
[52] U.S. Cl. .......................... 324/158.1; 324/537
[58] Field of Search .................. 324/158.1, 537, 324/538, 73.1, 754

[56] References Cited

U.S. PATENT DOCUMENTS

| | | |
|---|---|---|
| 4,597,025 | 6/1986 | Rutchik et al. ............................ 361/94 |
| 4,779,043 | 10/1988 | Williamson, Jr. ....................... 324/537 |
| 4,864,219 | 9/1989 | Parsons ................................. 324/73.1 |
| 5,319,515 | 6/1994 | Pryor et al. ............................... 361/93 |
| 5,399,975 | 3/1995 | Laing et al. ............................. 324/537 |
| 5,457,391 | 10/1995 | Shimizu et al. ........................ 324/546 |

*Primary Examiner*—Ernest Karlsen
*Attorney, Agent, or Firm*—George O. Saile; Stephen B. Ackerman; Larry J. Prescott

[57] ABSTRACT

A test board circuit for testing integrated circuit modules under stress conditions, such as temperature, humidity, and bias. The integrated circuit module under test is plugged into a test socket which is part of the test board circuit. Without protection electrical shorting between test socket contacts, either from improper plugging of the module under test or from the formation of conductive deposits on the socket contacts, causes erroneous results and can damage devices in the integrated circuit module under test. The test board circuit protects the devices in the integrated circuit module under test from damage due to shorting between test socket contacts and provides a voltage signal which can be used to detect when a short has occurred.

18 Claims, 4 Drawing Sheets

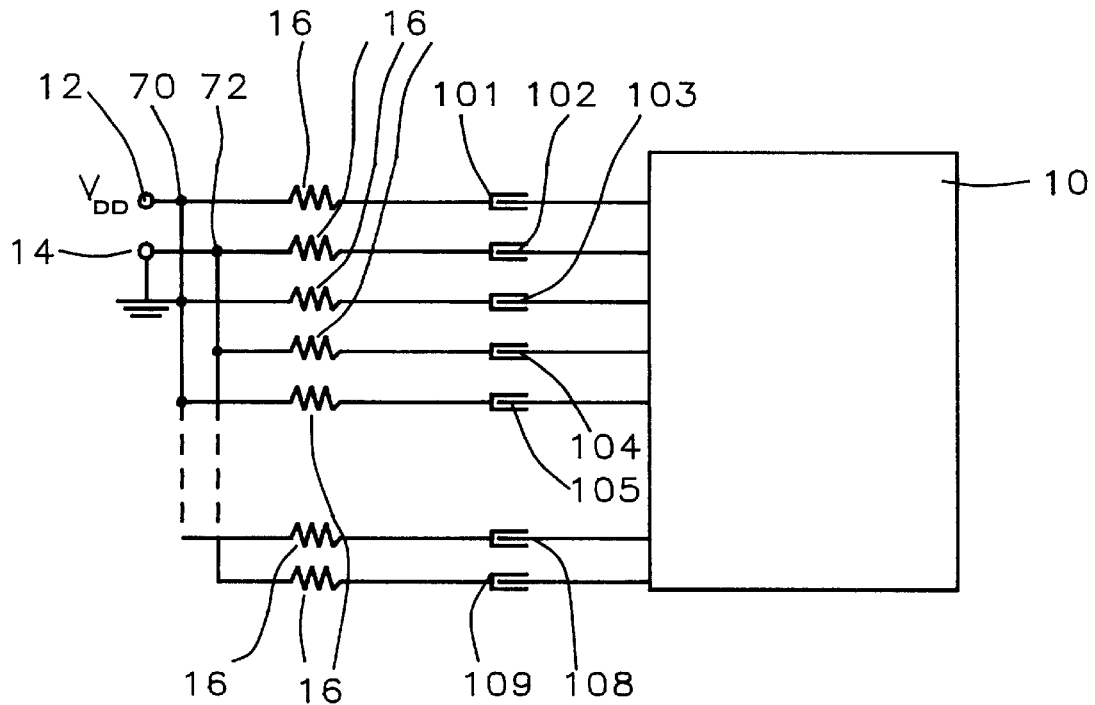
FIG. 1 – Prior Art
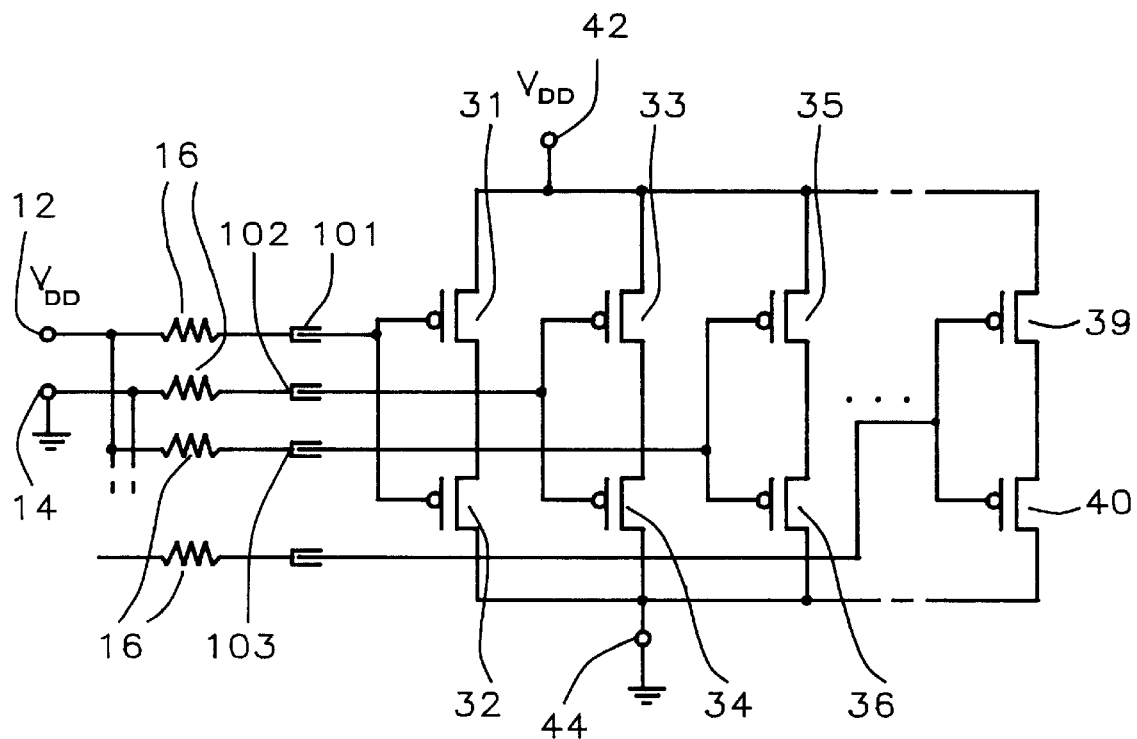
FIG. 2 – Prior Art

TEST BOARD CIRCUIT FOR DETECTING TESTER MALFUNCTION AND PROTECTING DEVICES UNDER TEST

BACKGROUND OF THE INVENTION (1) Field of the Invention

This invention relates to stress testing of integrated circuit modules and more particularly to detecting test board malfunction and to protecting devices under test from damage due to test board malfunction.

(2) Description of the Related Art

U.S. Pat. No. 5,319,515 to Pryor et al. describes a circuit protection circuit which uses the base or gate of a switching transistor to sense overcurrents. When an overcurrent is experienced, a control transistor switches on causing the switching transistor to turn off. A shunt switching circuit to shunt the overcurrent across the load may also be used.

U.S. Pat. No. 4,597,025 to Rutchik et al. describes an alternating current, overload current sensing, remote power controller.

U.S. Pat. No. 5,457,391 to Shimizu et al. describes a load short state detection circuit.

The invention of this Patent Application uses a resistor network to detect shorting between adjacent contacts of a test socket used in stress testing of integrated circuit modules. The resistor network forms a protection circuit which protects the modules under test as well as indicates when a malfunction has occurred.

SUMMARY OF THE INVENTION

Stress testing, such as temperature humidity bias testing, of integrated circuit modules is of considerable importance in the manufacture of integrated circuits, especially CMOS, complimentary metal oxide semiconductor, field effect transistor or other field effect transistor circuits. Such stress testing is used to establish the reliability of such circuits as well as burn-in of such circuits to eliminate unreliable devices and thereby improve overall reliability of the surviving devices. Stress testing of this type typically uses a test socket to supply the bias stress conditions with the input/output pins of the module undergoing the stress testing being plugged into the test socket. The test socket contacts are usually quite close together and of course match the spacings of the input/output pins of the module or device under test.

One of the problems frequently encountered in this type of testing is electrical shorts between adjacent test socket contacts. These electrical shorts can develop due to the formation of conductive residue on the test socket contacts in the stress test environment. Electrical shorts can also occur if the module input/output pins are inadvertently plugged between two adjacent test socket contacts rather than into the test socket contacts. Such electrical shorts can provide erroneous test results and can damage the devices undergoing the stress testing.

Refer now to FIG. 1, there is shown a schematic diagram of a conventional test socket and circuit. The integrated circuit module under test 10 is shown plugged into a test socket having N socket contacts, a first socket contact 101, second socket contact 102, third socket contact 103, fourth socket contact 104, . . . , N–1 socket contact 108, and Nth socket contact 109. A first supply node 70 is connected to a $V_{DD}$ supply voltage 12. Resistors 16 having resistance R are connected between the first supply node 70 and the odd numbered socket contacts, 101, 103 etc. A second supply node 72 is connected to a $V_{SS}$ supply voltage 14, in this example ground. Resistors 16 having resistance R are connected between the second supply node 72 and the even numbered socket contacts, 102, 104 etc.

FIG. 2 shows an example of how the conventional test socket of FIG. 3 is connected to the integrated circuit under test. A number of P channel metal oxide semiconductor, PMOS, field effect transistor and N channel metal oxide semiconductor, NMOS, field effect transistor pairs, 31 and 32, 33 and 34, 35 and 36, 39 and 40 are connected in parallel. The source contacts of the PMOS transistors, 31, 33, 35, and 39, are connected to the $V_{DD}$ supply voltage 42. The source contacts of the NMOS transistors, 32, 34, 36, and 40, are connected to the $V_{SS}$ supply voltage 44, in this example ground. The drain contacts of the PMOS transistor and NMOS transistor of each pair are connected together. The gate contacts of the PMOS transistor and NMOS transistor of each pair are connected together and to one of the test socket contacts, 101, 102, 103, etc. Under this arrangement the gates of both transistors of each pair will be either at $V_{DD}$ or at ground so that one of the transistors of each pair is biased on, the other transistor of the pair is biased off and no current flows through the transistor pair.

FIG. 3 shows the condition of an electrical short 52 caused by improper plugging of the module under test into the test socket. FIG. 4 shows the condition of an electrical short 56 caused by conductive residue formed between two adjacent socket contacts. The electrical short between two adjacent socket contacts biases the gates of the transistor pairs connected to the shorted socket contacts at $V_{DD}/2$. Under this gate bias of $V_{DD}/2$ significant current will flow through both of these transistor pairs producing erroneous test results and probable device damage.

It is an objective of this invention to provide a test board circuit which, under conditions of an electrical short between adjacent test socket contacts, will provide a voltage of nearly $V_{SS}$ at the shorted test socket contacts, thereby keeping the NMOS transistor of the transistor pair connected to the shorted test socket contacts turned off, and provide for automatic monitoring of test socket shorting.

This objective is achieved by connecting either the even test socket contacts directly to the $V_{SS}$ voltage supply and a resistor network to the odd test socket contacts or the odd test socket contacts directly to the $V_{DD}$ voltage supply and a resistor network to the even test socket contacts. A monitor line is connected to the resistor network and provides a voltage which can be monitored to indicate test socket shorting.

BRIEF DESCRIPTION OF THE DRAWINGS

FIG. 1 shows a schematic diagram of a prior art test board circuit.

FIG. 2 shows a schematic diagram of devices under test using a prior art test board circuit.

DESCRIPTION OF THE PREFERRED EMBODIMENTS

Figure 3:
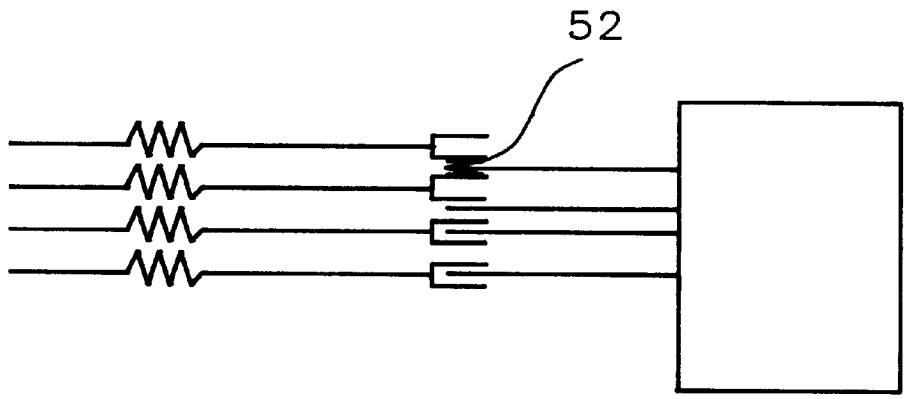
FIG. 3 shows a schematic diagram of a short between two adjacent test socket contacts caused by improper plugging of the module under test.
Figure 4:
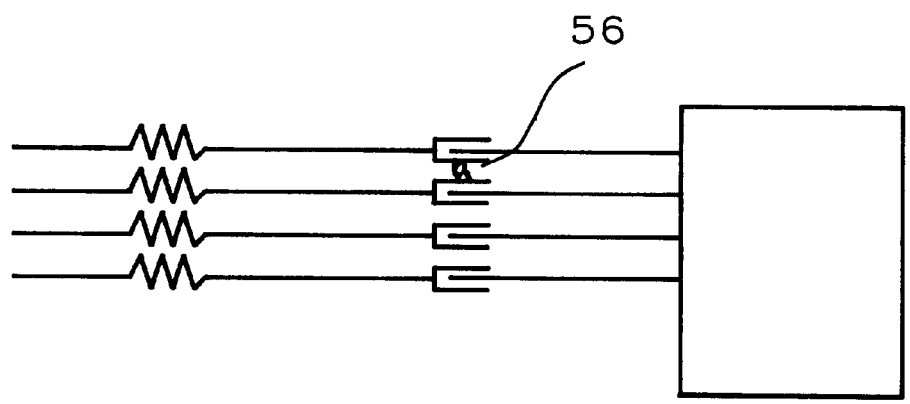
FIG. 4 shows a schematic diagram of a short between two adjacent test socket contacts caused by conductive residue on the test socket contacts.
Figure 5:
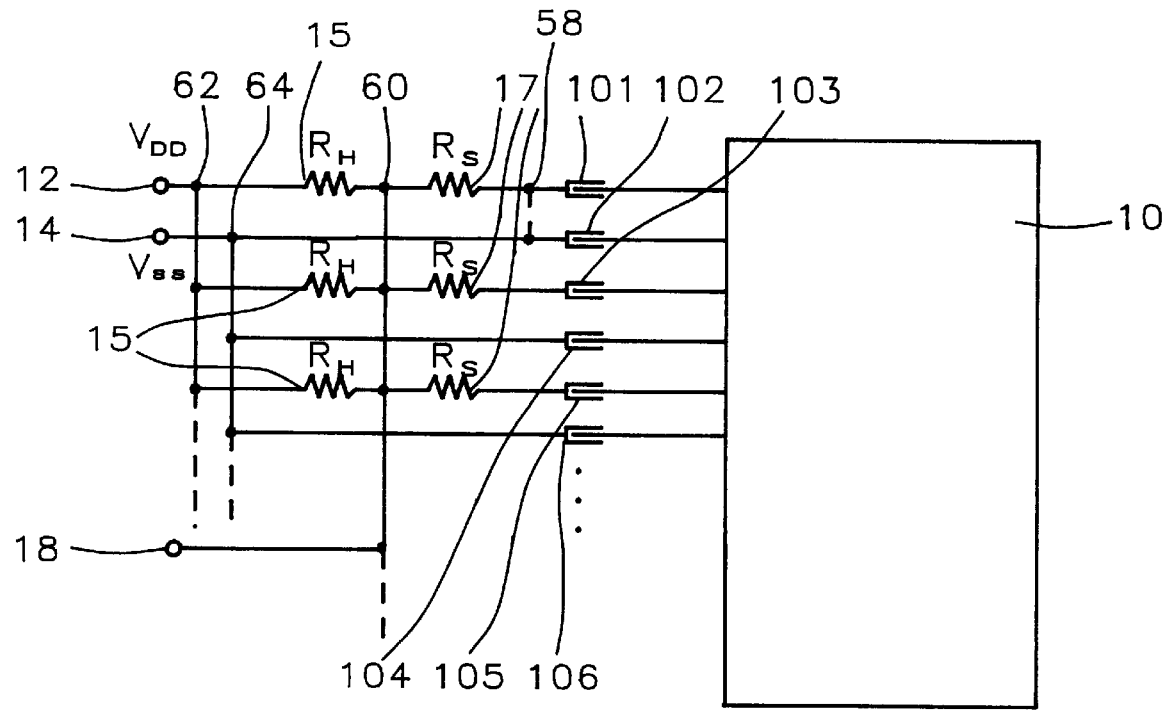
FIG. 5 shows a schematic diagram of the test board circuit of this invention with the even numbered test socket contacts connected directly to the $V_{SS}$ supply voltage.
Figure 6:
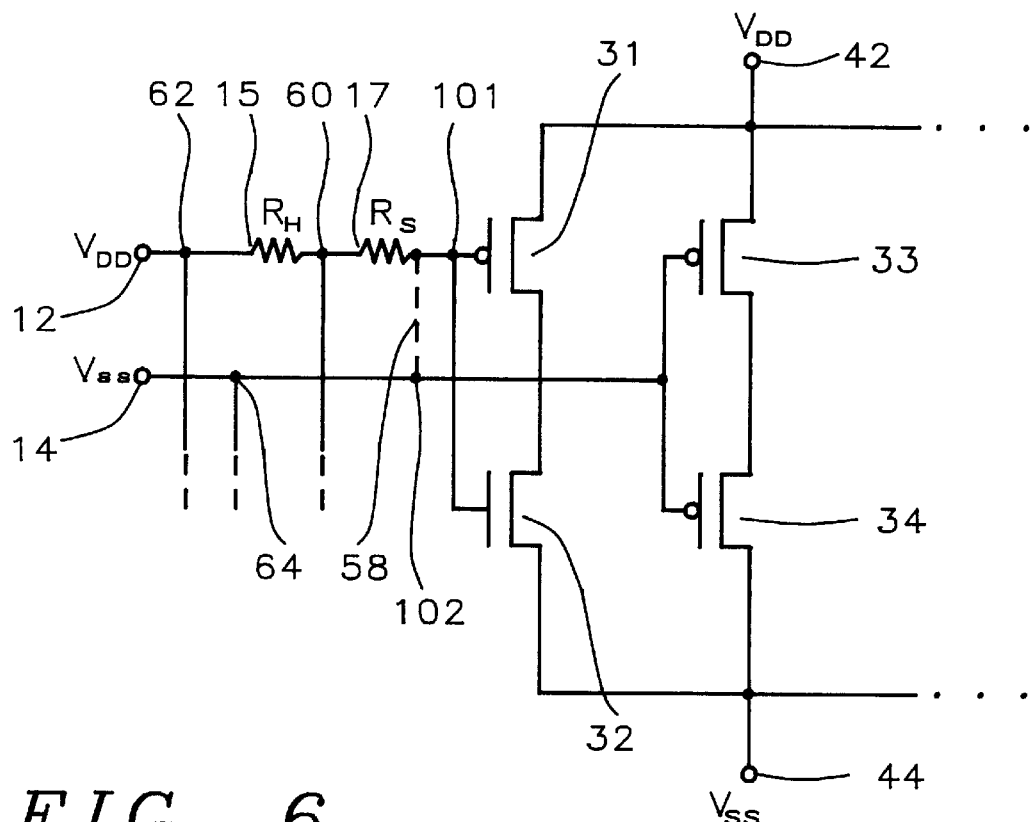
FIG. 6 shows a schematic diagram of devices under test using the test board circuit of FIG. 5.

Refer now to FIGS. 5 and 6, there is shown an embodiment of the test board circuit of this invention. As shown in FIG. 5 the test board has a test socket with a first number, $N_1$, of odd numbered connectors, 101, 103, 105, etc., and a second number, $N_2$, of even numbered connectors, 102, 104, 106, etc. FIG. 5 shows only three odd numbered connectors 101, 103, and 105 and three even numbered connectors 102, 104, and 106 with additional connectors being added in the same pattern. The first number, $N_1$, is either equal to the second number, $N_2$, or one greater than the second number, $N_2$. Each of the odd numbered connectors is adjacent to one of the even numbered connectors and each of the even connectors is adjacent to one of the odd numbered connectors. The input/output pins of the integrated circuit module 10 under test are plugged into the test socket connectors, 101, 102, 103, 104, 105, 106, etc., as shown in FIG. 5.

As shown in FIG. 5, a control node 60 is connected to a control node output terminal 18. A low value resistor 17, having a resistance $R_S$ of less than about 10 ohms, is connected between each of the odd numbered test socket connectors and the control node 60, so that there are a total of $N_1$ low value resistors. A first supply node 62 is connected to the $V_{DD}$ voltage supply 12 and a second supply node 64 is connected to the $V_{SS}$ voltage supply 14. The first number, $N_1$, of high value resistors 15, having a resistance $R_H$ greater than about 4000 ohms, are connected between the first supply node 62 and the control node 60. The second supply node 64 is connected directly to each of the even numbered test socket contacts.

FIG. 6 shows the integrated circuit module under test which is plugged into the test socket. A first number of even numbered PMOS and NMOS pairs and a second number of even numbered PMOS and NMOS pairs, two pairs being shown in FIG. 6, have the sources of the PMOS transistors, 31 and 33, connected to the $V_{DD}$ supply voltage 42 and the sources of the NMOS transistors, 32 and 34, connected to the $V_{SS}$ supply voltage 44. The drains of the PMOS transistor and NMOS transistor of each pair are connected together. The gates of the PMOS transistor and NMOS transistor of each odd numbered PMOS and NMOS pair are connected to one of the odd numbered contacts 101 of the test socket. The gates of the PMOS transistor and NMOS transistor of each even numbered PMOS and NMOS pair are connected to one of the even numbered contacts 102 of the test socket. The low value resistors, $R_S$, and high value resistors, $R_H$, are connected as described in the preceding paragraph.

Under normal operation the voltage at the odd numbered test socket connectors, 101, 103, etc., and the gates of the PMOS transistor and NMOS transistor of each odd numbered transistor pair is $V_{DD}$, in this example between about 4 and 6 volts or equal to or greater than $V_{OH\ MIN}$ which is specified in the integrated circuit product data sheet. The voltage at the even numbered test socket connectors, 102, 104, etc., and the gates of the PMOS transistor and NMOS transistor of each even numbered transistor pair is $V_{SS}$, in this example 0 volts. Under normal conditions the voltage at the control node 60 is $V_{DD}$. The problem is encountered when an electrical short, shown by a dashed conductor 58 in FIGS. 5 and 6, develops between adjacent test socket connectors such as the first odd numbered connector 101 and the first even numbered connector 102. Under the conditions of the short the voltage at both shorted contacts, 101 and 102, becomes $V_{SS}$ and the voltage at the control node 60 becomes $$V_{SS}+((V_{DD}-V_{SS})\times R_S)/((R_H/N_1)+R_S).$$

In this example where $V_{DD}$ is 5 volts, $V_{SS}$ is 0 volts, $R_H$ is 5000 ohms, $R_S$ is 5 ohms, and $N_1$ is 100 the voltage at the control node 60 drops to 0.45 volts. The voltage at the control node 60 will drop to 0.45 volts or less if $R_H/(N_1 \times R_S)$ is equal to or greater than 10. $R_H$, $R_S$, and $N_1$, are chosen so that $R_H/(N_1 \times R_S)$ is equal to or greater than 10.

Under the condition of the electrical short between two adjacent test socket contacts the voltage at the gates of the PMOS and NMOS transistors in the integrated circuit module under test will be $V_{SS}$ and NMOS transistors will be turned off. The control node 60 is connected to a control output terminal 18. A control circuit connected to the control output terminal 18 senses the voltage drop at the control node and provides a signal that a malfunction has occurred.

Figure 7:
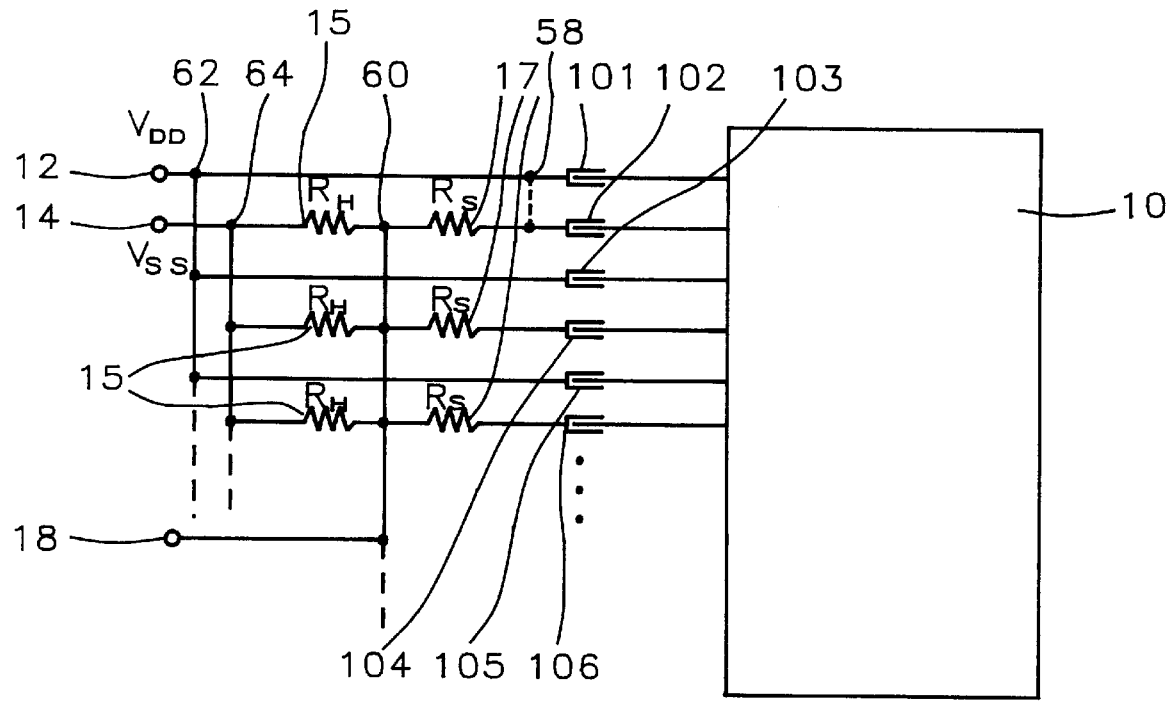
FIG. 7 shows a schematic diagram of the test board circuit of this invention with the odd numbered test socket contacts connected directly to the $V_{DD}$ supply voltage.
Figure 8:
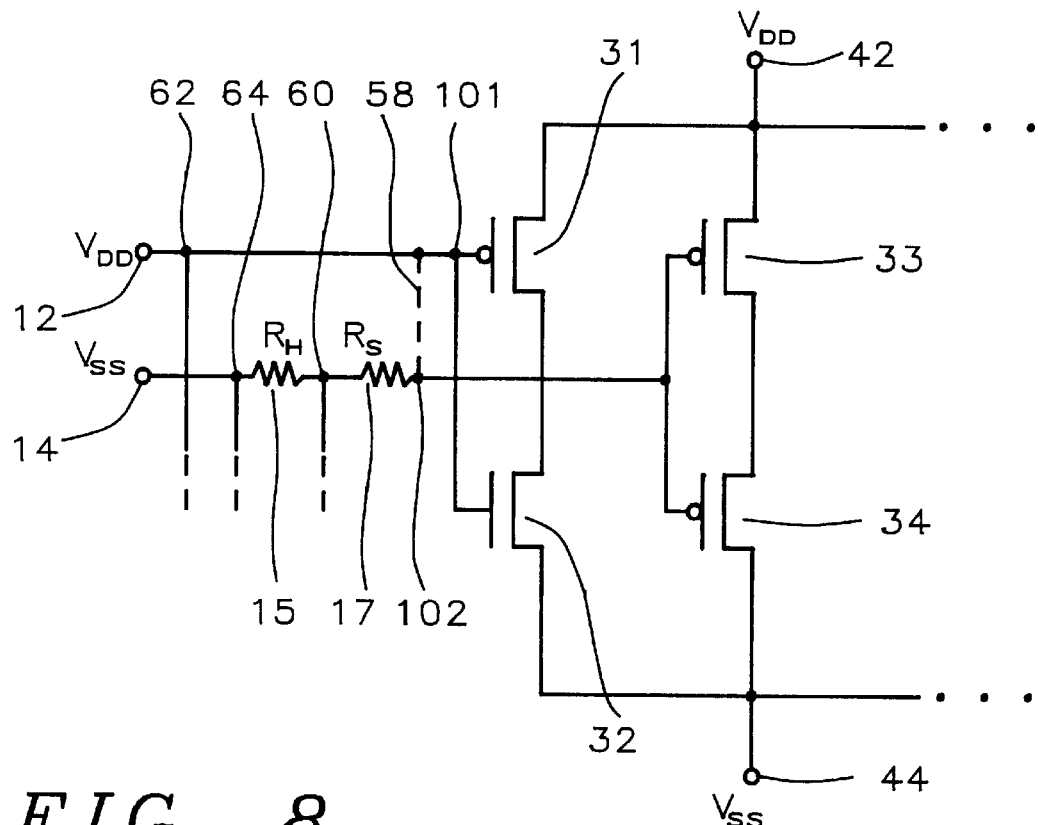
FIG. 8 shows a schematic diagram of devices under test using the test board circuit of FIG. 7.

Another embodiment of the test board circuit of this invention is shown in FIGS. 7 and 8. In this embodiment the PMOS and NMOS pairs in the integrated circuit module under test are connected as described in the preceding embodiment, see FIG. 8. As shown in FIG. 7, in this embodiment the odd numbered test socket contacts 101, 103, 105, etc. are connected to the first supply node 62 which is connected to the $V_{DD}$ voltage supply 12, in this example between about 4 and 6 volts or equal to or greater than $V_{OH\ MIN}$. A control node 60 is connected to a control node output terminal 18. A low value resistor 17, having a resistance $R_S$ of less than 10 ohms, is connected between each of the even numbered test socket connectors, 102, 104, 106, etc. and the control node 60, so that there are a total of $N_2$ low value resistors. A second supply node 64 is connected to the $V_{SS}$ voltage supply 14, in this example 0 volts. The second number $N_2$, in this example less than 120, of high value resistors 15, having a resistance $R_H$ of greater than about 4000 ohms, are connected between the second supply node 64 and the control node 60. The first supply node 62 is connected directly to each of the even numbered test socket contacts. The second number $N_2$ is equal to the first number $N_1$ or one less than the first number $N_1$.

Under normal operation the voltage at the odd numbered test socket connectors, 101, 103, etc., and the gates of the PMOS transistor and NMOS transistor of each odd numbered transistor pair is $V_{DD}$, in this example between about 4 and 6 volts or equal to or greater than $V_{OH\ MIN}$, and the voltage at the even numbered test socket connectors, 102, 104, etc., and the gates of the PMOS transistor and NMOS transistor of each even numbered transistor pair is $V_{SS}$, in this example 0 volts. Under normal conditions the voltage at the control node 60 is $V_{SS}$. The problem is encountered when an electrical short, shown by a dashed conductor 58 in FIGS. 7 and 8, develops between adjacent test socket connectors such as the first odd numbered connector 101 and the first even numbered connector 102. Under the conditions of the short the voltage at both shorted contacts, 101 and 102, becomes $V_{DD}$ and the voltage at the control node 60 becomes $$V_{SS}+((V_{DD}-V_{SS})\times(R_H/N_2))/((R_H/N_2)+R_S).$$

In this example where $V_{DD}$ is 5 volts, $V_{SS}$ is 0 volts, $R_H$ is 5000 ohms, $R_S$ is 5 ohms, and $N_2$ is 100 the voltage at the control node 60 increases to 4.5 volts. The voltage at the control node 60 will increase to 4.5 volts or greater if $R_H/(N_2 \times R_S)$ is equal to or greater than 10. $R_H$, $R_S$, and $N_2$, are chosen so that $R_H/(N_2 \times R_S)$ is equal to or greater than 10.

Under the condition of the electrical short between two adjacent test socket contacts the voltage at the gates of the PMOS and NMOS transistors in the integrated circuit module under test will be $V_{DD}$ and the PMOS transistors will be turned off. The control node 60 is connected to a control output terminal 18. A control circuit connected to the control output terminal 18 senses the voltage increase at the control node and provides a signal that a malfunction has occurred.

While the invention has been particularly shown and described with reference to the preferred embodiments thereof, it will be understood by those skilled in the art that various changes in form and details may be made without departing from the spirit and scope of the invention.

What is claimed is:

1. A test board circuit, comprising:
   a first voltage supply;
   a second voltage supply;
   a first number of first resistors and said first number of second resistors wherein each said first resistor has a first resistance, each said second resistor has a second resistance, and the ratio of said first resistance to said second resistance is equal to or greater than said first number multiplied by ten;
   a test socket having said first number of first connectors and a second number of second connectors wherein each said first connector is adjacent to one of said second connectors, each said second connector is adjacent to one of said first connectors, and said first number is equal to said second number or one greater than said second number;
   a first supply node connected to said first voltage supply;
   a second supply node connected to said second voltage supply and to each of said second number of said second connectors;
   a control node wherein each of said first number of first resistors are connected between said first supply node and said control node and each of said first number of second resistors are connected between said control node and one of said first connectors; and
   a control circuit connected to said control node.

2. The test board circuit of claim 1 wherein said first number is less than 120.

3. The test board circuit of claim 1 wherein said first resistance is greater than 4000 ohms.

4. The test board circuit of claim 1 wherein said second resistance is less than 10 ohms.

5. The test board circuit of claim 1 wherein said first voltage supply supplies a voltage of between about 4 and 6 volts to said first supply node.

6. The test board circuit of claim 1 wherein said first voltage supply supplies a voltage which is greater than or equal to $V_{OH\ MIN}$ to said first supply node.

7. The test board circuit of claim 1 wherein said second voltage supply supplies a voltage of about zero volts to said second supply node.

8. The test board circuit of claim 1 wherein an integrated circuit module having input/output pins is connected to said test socket by means of inserting said input/output pins into said first connectors and said second connectors.

9. The test board circuit of claim 1 wherein said control circuit connected to said control node is used to measure the voltage at said control node thereby detecting if a short circuit is formed between any of said first contacts and any of said second contacts.

10. A test board circuit, comprising:
    a first voltage supply;
    a second voltage supply;
    a first number of first resistors and said first number of second resistors wherein each said first resistor has a first resistance, each said second resistor has a second resistance, and the ratio of said first resistance to said second resistance is equal to or greater than said first number multiplied by ten;
    a test socket having a second number of first connectors and said first number of second connectors wherein each said first connector is adjacent to one of said second connectors, each said second connector is adjacent to one of said first connectors, and said second number is equal to said first number or one greater than said first number;
    a first supply node connected to said first voltage supply and to each of said second number of said first connectors;
    a second supply node connected to said second voltage supply;
    a control node wherein each of said first number of first resistors are connected between said second supply node and said control node and each of said first number of second resistors are connected between said control node and one of said second connectors; and
    a control circuit connected to said control node.

11. The test board circuit of claim 10 wherein said first number is less than 120.

12. The test board circuit of claim 10 wherein said first resistance is greater than 4000 ohms.

13. The test board circuit of claim 10 wherein said second resistance is less than 10 ohms.

14. The test board circuit of claim 10 wherein said first voltage supply supplies a voltage of between about 4 and 6 volts to said first supply node.

15. The test board circuit of claim 10 wherein said first voltage supply supplies a voltage which is greater than or equal to $V_{OH\ MIN}$ to said first supply node.

16. The test board circuit of claim 10 wherein said second voltage supply supplies a voltage of about zero volts to said second supply node.

17. The test board circuit of claim 10 wherein an integrated circuit module having input/output pins is connected to said test socket by means of inserting said input/output pins into said first connectors and said second connectors.

18. The test board circuit of claim 10 wherein said control circuit connected to said control node is used to measure the voltage at said control node thereby detecting if a short circuit is formed between any of said first contacts and any of said second contacts.

* * * * *